(12) United States Patent
Matsuura

(10) Patent No.: US 12,341,006 B2
(45) Date of Patent: Jun. 24, 2025

(54) HEAT TREATMENT METHOD AND HEAT TREATMENT APPARATUS

(71) Applicant: Tokyo Electron Limited, Tokyo (JP)

(72) Inventor: Hiroyuki Matsuura, Iwate (JP)

(73) Assignee: TOKYO ELECTRON LIMITED, Tokyo (JP)

(\*) Notice: Subject to any disclaimer, the term of this patent is extended or adjusted under 35 U.S.C. 154(b) by 606 days.

(21) Appl. No.: 16/993,500

(22) Filed: Aug. 14, 2020

(65) Prior Publication Data

US 2021/0057217 A1 Feb. 25, 2021

(30) Foreign Application Priority Data

Aug. 20, 2019 (JP) .................. 2019-150686

(51) Int. Cl.
| | |
|---|---|
| *H01L 21/02* | (2006.01) |
| *C23C 16/24* | (2006.01) |
| *C23C 16/56* | (2006.01) |
| *H01L 21/67* | (2006.01) |

(52) U.S. Cl.
CPC ........ *H01L 21/02667* (2013.01); *C23C 16/24* (2013.01); *C23C 16/56* (2013.01); *H01L 21/02595* (2013.01); *H01L 21/0262* (2013.01); *H01L 21/67103* (2013.01); *H01L 21/02532* (2013.01); *H01L 21/02592* (2013.01)

(58) Field of Classification Search
CPC ......... H01L 21/02532; H01L 21/02592; H01L 21/02595; H01L 21/02598; H01L 21/02667; H01L 21/02672
See application file for complete search history.

(56) References Cited

U.S. PATENT DOCUMENTS

| | | | | |
|---|---|---|---|---|
| 5,797,999 | A | * 8/1998 | Sannomiya | ........... H01L 31/186 136/258 |
| 6,133,076 | A | * 10/2000 | Yamazaki | ......... H01L 21/02532 349/39 |
| 7,419,861 | B2 | 9/2008 | Tanaka et al. | |
| 2002/0100409 | A1 | 8/2002 | Jang et al. | |
| 2012/0025200 | A1* | 2/2012 | Aoyama | ........... H01L 21/02381 257/75 |

(Continued)

FOREIGN PATENT DOCUMENTS

| | | |
|---|---|---|
| CN | 102496577 A | 6/2012 |
| JP | H11-074198 A | 3/1999 |

(Continued)

OTHER PUBLICATIONS

Jeong No Lee, Yong Woo Choi, Bum Joo Lee, and Byung Tae Ahn, "Microwave-induced low-temperature crystallization of amorphous silicon thin films", Journal of Applied Physics 82, 2918-2921 (1997) (Year: 1997).*

(Continued)

*Primary Examiner* — Brigitte A Paterson
(74) *Attorney, Agent, or Firm* — Venjuris, P.C.

(57) ABSTRACT

A heat treatment method includes: forming an amorphous silicon film having a hydrogen concentration in a film of $5 \times 10^{19}$ atoms/cm$^3$ or more, on a substrate; and irradiating the substrate with microwaves to heat the amorphous silicon film thereby forming a polycrystalline silicon film from the amorphous silicon film.

8 Claims, 8 Drawing Sheets

| HYDROGEN CONCENTRATION IN FILM [atoms/cm³] | ANNEALING TEMPERATURE [°C] | ANNEALING TIME [min] | TEM IMAGE |
|---|---|---|---|
| $6 \times 10^{20}$ | 520 | 50 | |
| $5 \times 10^{19}$ | 520 | 50 | |
| $3 \times 10^{19}$ | 520 | 50 | |
| $1 \times 10^{19}$ | 520 | 50 | |

(56) References Cited

U.S. PATENT DOCUMENTS

2013/0029497 A1* 1/2013 Chin ............... H01L 21/02532
438/758
2014/0287588 A1 9/2014 Takahashi

FOREIGN PATENT DOCUMENTS

| JP | 2011-249780 A | 12/2011 |
| JP | 2012-234864 A | 11/2012 |
| WO | 2017/056243 A | 4/2017 |

OTHER PUBLICATIONS

Jin Hyung Ahn, Jeong No Lee, Yoon Chang Kim, Byung Tae Ahn, Microwave-induced low-temperature crystallization of amorphous Si thin films, Current Applied Physics, vol. 2, Issue 2, 2002 p. 135-139 (Year: 2002).*

Jin Hyung Ahn, Ji Hye Eom & Byung Tae Ahn Member (2001) Enhanced crystallization of amorphous Si using viscous Ni solution and microwave annealing, Journal of Information Display, 2:2, 7-12 (Year: 2001).*

* cited by examiner

FIG.3

| HYDROGEN CONCENTRATION IN FILM [atoms/cm³] | ANNEALING TEMPERATURE [°C] | ANNEALING TIME [min] | TEM IMAGE |
|---|---|---|---|
| $6\times10^{20}$ | 520 | 50 | |
| $5\times10^{19}$ | 520 | 50 | |
| $3\times10^{19}$ | 520 | 50 | |
| $1\times10^{19}$ | 520 | 50 | |

| HEATING METHOD | MICROWAVE HEATING | |
|---|---|---|
| HYDROGEN CONCENTRATION IN FILM | $1 \times 10^{20}$ [atoms/cm$^3$] | |
| EBSD MAPPING IMAGE | TWIN GRAIN BOUNDARY Σ3-CSL IS USED AS CRYSTAL GRAIN BOUNDARY | TWIN GRAIN BOUNDARY Σ3-CSL IS NOT USED AS CRYSTAL GRAIN BOUNDARY |
| |  |  |
| AVERAGE GRAIN SIZE | 0.36 μm | 0.48 μm |
| MAXIMUM GRAIN SIZE | 2.02 μm | 3.71 μm |

| HEATING METHOD | MICROWAVE HEATING | |
|---|---|---|
| HYDROGEN CONCENTRATION IN FILM | $5 \times 10^{18}$ [atoms/cm$^3$] | |
| EBSD MAPPING IMAGE | TWIN GRAIN BOUNDARY Σ3-CSL IS USED AS CRYSTAL GRAIN BOUNDARY | TWIN GRAIN BOUNDARY Σ3-CSL IS NOT USED AS CRYSTAL GRAIN BOUNDARY |
| |  |  |
| AVERAGE GRAIN SIZE | 0.30 μm | 0.43 μm |
| MAXIMUM GRAIN SIZE | 1.15 μm | 1.35 μm |

| HEATING METHOD | MICROWAVE HEATING | |
|---|---|---|
| HYDROGEN CONCENTRATION IN FILM | $3\times10^{19}$ [atoms/cm$^3$] | |
| EBSD MAPPING IMAGE | TWIN GRAIN BOUNDARY Σ3-CSL IS USED AS CRYSTAL GRAIN BOUNDARY | TWIN GRAIN BOUNDARY Σ3-CSL IS NOT USED AS CRYSTAL GRAIN BOUNDARY |
| |  |  |
| AVERAGE GRAIN SIZE | 0.25 μm | 0.30 μm |
| MAXIMUM GRAIN SIZE | 0.78 μm | 0.78 μm |

FIG.8

| HEATING METHOD | RESISTANCE HEATING | |
|---|---|---|
| HYDROGEN CONCENTRATION IN FILM | $1 \times 10^{20}$ [atoms/cm$^3$] | |
| EBSD MAPPING IMAGE | TWIN GRAIN BOUNDARY Σ3-CSL IS USED AS CRYSTAL GRAIN BOUNDARY | TWIN GRAIN BOUNDARY Σ3-CSL IS NOT USED AS CRYSTAL GRAIN BOUNDARY |
| AVERAGE GRAIN SIZE | 0.24 μm | 0.44 μm |
| MAXIMUM GRAIN SIZE | 1.35 μm | 2.15 μm |

HEAT TREATMENT METHOD AND HEAT TREATMENT APPARATUS

CROSS-REFERENCE TO RELATED APPLICATION

This application is based on and claims priority from Japanese Patent Application No. 2019-150686 filed on Aug. 20, 2019 with the Japan Patent Office, the disclosure of which is incorporated herein in its entirety by reference.

TECHNICAL FIELD

The present disclosure relates to a heat treatment method and a heat treatment apparatus.

BACKGROUND

There is known a technique of forming a polycrystalline semiconductor film from an amorphous semiconductor film by irradiating a substrate with microwaves to anneal the amorphous semiconductor film formed on the substrate (see, e.g., Japanese Patent Laid-Open No. 2012-234864).

SUMMARY

A heat treatment method according to an aspect of the present disclosure includes: forming an amorphous silicon film having a hydrogen concentration in the film of $5\times10^{19}$ atoms/cm$^3$ or more on a substrate; and irradiating the substrate with microwaves to heat the amorphous silicon film thereby forming a polycrystalline silicon film from the amorphous silicon film.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 3 is a diagram illustrating a crystallized state of an a-Si film.

FIG. 8 is a diagram illustrating a result of evaluation of crystallinity when an a-Si film having a hydrogen concentration in the film of $1\times10^{20}$ atoms/cm$^3$ is heated by microwaves.

DETAILED DESCRIPTION

Figure 1:
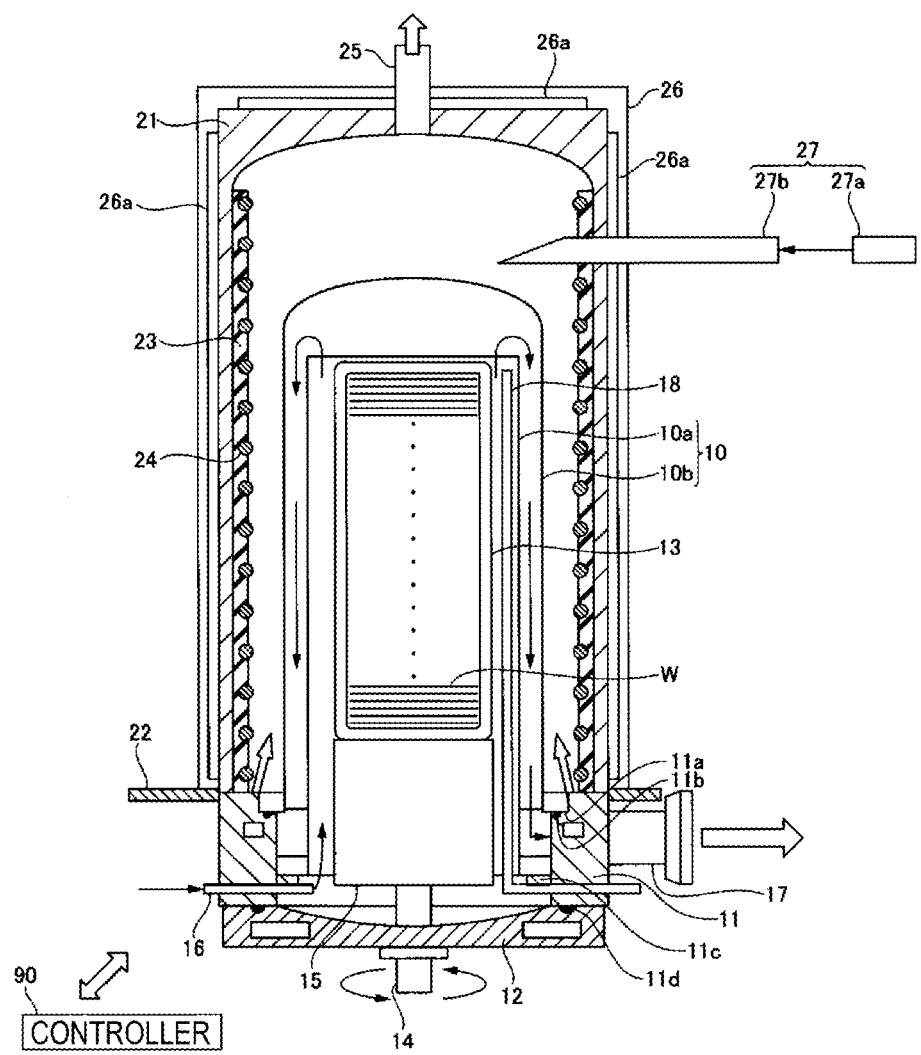
FIG. 1 is a diagram illustrating an example of a heat treatment apparatus.

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Hereinafter, non-limiting embodiments of the present disclosure will be described with reference to the accompanying drawings. In the accompanying drawings, the same or corresponding members or parts are denoted by the same or corresponding reference numerals, and redundant explanations thereof are omitted.

[Heat Treatment Apparatus]

A heat treatment apparatus of an embodiment will be described with reference to FIG. 1. FIG. 1 is a diagram illustrating an example of a heat treatment apparatus. The heat treatment apparatus illustrated in FIG. 1 is a batch type apparatus that performs a heat treatment on a plurality of substrates at one time.

The heat treatment apparatus has a processing container 10. The processing container 10 has a vertically long cylindrical shape and accommodates therein a semiconductor wafer (hereinafter, referred to as a "wafer W") which is a substrate. The processing container 10 includes a cylindrical inner pipe 10a and a cylindrical outer pipe 10b having a ceiling whose lower end is opened to cover the outside of the inner pipe 12. The inner pipe 10a and the outer pipe 10b have a small microwave absorptivity and are formed of quartz which is a heat-resistant material, and are coaxially arranged to have a double pipe structure.

The lower end of the processing container 10 is supported by a cylindrical manifold 11 formed of, for example, stainless steel. An outer pipe support 11a is formed on an upper end of the manifold 11. The outer pipe support 11a supports the lower end of the outer pipe 10b. A seal member 11b such as an O-ring is provided between the outer pipe support 11a and the lower end of the outer pipe 10b, and the inside of the outer pipe 10b is kept airtight by the seal member 11b.

An annular inner pipe support 11c is formed on the inner wall of the manifold 11. The inner pipe support 11c supports the lower end of the inner pipe 10a. A lid 12 is airtightly attached to an opening at the lower end of the manifold 11 via a seal member 11d such as an O-ring. As a result, the opening at the lower end of the processing container 10, that is, the opening of the manifold 11 is airtightly closed. The lid 12 is formed of, for example, stainless steel. The upper surface of the lid 12 is formed in, for example, a concave shape. As a result, the microwaves introduced into a metal chamber 21 from a microwave introducing unit 27 (to be described later) are reflected and scattered on the upper surface of the lid 12, and are evenly distributed in the metal chamber 21.

A rotary shaft 14 is provided to rotatably support a wafer boat 13 at a central portion of the lid 12 through a magnetic fluid seal (not illustrated). The rotating shaft 14 is rotatably supported by an elevating unit (not illustrated) such as a boat elevator.

The wafer boat 13 holding a wafer W is mounted on the upper end of the rotary shaft 14. The wafer boat 13 may be accommodated in the processing container 10 and holds a plurality of wafers W in a shelf shape at predetermined intervals. The wafer boat 13 moves up and down together with the lid 12 by raising and lowering the elevating unit. As a result, the wafer boat 13 is inserted into and removed from the processing container 10. A heat insulating cylinder 15 is provided between the lid 12 and the wafer boat 13. The heat insulating cylinder 15 is made of, for example, quartz, and keeps the wafer boat 13 warm by preventing the wafer boat 13 from being cooled by heat transfer with the lid 12.

The manifold 11 is provided with a gas supply pipe 16 that supplies a predetermined gas such as a film forming gas, a processing gas (e.g., an etching gas), or a purge gas into the inner pipe 10a. The gas supply pipe 16 is made of, for example, quartz. The gas supply pipe 16 is supported to penetrate the manifold 11. The tip of the gas supply pipe 16 is open, and a predetermined gas is discharged from the tip. A predetermined gas whose flow rate is controlled is supplied into the processing container 10 via a gas supply pipe 16. In the example of FIG. 1, one gas supply pipe 16 is illustrated, but, the present disclosure is not limited thereto. For example, a plurality of gas supply pipes 16 may be provided for each type of gas. Also, in FIG. 1, the flow of gas supplied from the gas supply pipe 16 is indicated by a thin arrow.

The manifold 11 is provided with an exhaust pipe 17 that exhausts the gas in the processing container 10. The gas in the processing container 10 is exhausted from the exhaust pipe 17.

The manifold 11 is provided with a temperature sensor 18 that detects the temperature inside the inner pipe 10a. The temperature sensor 18 is provided in the inner pipe 10a along the longitudinal direction thereof, and is provided such that the base end thereof is bent into an L shape and penetrates the manifold 11. The temperature sensor 18 is, for example, a thermocouple or a resistance temperature detector.

A metal chamber 21 is provided around the processing container 10. The metal chamber 21 has a curved ceiling surface and is formed in a cylindrical shape with an open lower end. The lower end of the metal chamber 21 is supported by the manifold 11. The metal chamber 21 is made of a metal material such as stainless steel, aluminum, or an aluminum alloy, and the inner surface thereof is mirror-finished so that the introduced microwaves are multiply reflected to efficiently heat the wafer W.

A heat insulating material 23 is provided on an inner peripheral wall of the metal chamber 21. The heat insulating material 23 is formed in a cylindrical shape. The lower end of the heat insulating material 23 is supported by the manifold 11. The heat insulating layer 23 is formed of, for example, a mixture of a relatively soft amorphous silica and alumina having a low thermal conductivity. The heat insulating material 23 is arranged such that the inner circumference thereof is separated from the outer surface of the outer pipe 10b by a predetermined distance.

A resistance heating element 24 is arranged around the inner peripheral wall of the heat insulating material 23 in a spiral shape. The resistance heating element 24 is connected to a power supply and generates heat when power is supplied to heat the wafer W held by the wafer boat 13. The resistance heating element 24 is, for example, a heater element wire formed of a wire material having a circular cross section. Further, the resistance heating element 24 may be, for example, a heater wire formed of a thin plate member having a rectangular cross section. The resistance heating element 24 has, for example, a groove formed in a spiral shape on the inner peripheral wall of the heat insulating material 23, and is fitted and fixed in the groove. Further, the resistance heating element 24 may be divided into a plurality of zones in the vertical direction. When the resistance heating element 24 is divided into a plurality of zones in the vertical direction, the temperature of the processing container 10 in the vertical direction may be adjusted by controlling the heat generation amount of the resistance heating element 24 for each zone.

A coolant (e.g., air) is introduced into a space between the outer pipe 10b and the metal chamber 21 from a coolant introducing unit (not illustrated) formed in the manifold 11. A coolant exhaust unit 25 is provided on the ceiling of the metal chamber 21, and the coolant introduced into the space is exhausted from the coolant exhaust unit 25. Thus, the inside of the processing container 10 may be cooled in a short time. In FIG. 1, the flow of the coolant introduced from the coolant introducing unit is indicated by a thick arrow.

A water cooling jacket 26 is provided around the metal chamber 21 so as to cover the outer periphery and the ceiling of the metal chamber 21. The lower end of the water cooling jacket 26 is supported by a base plate 22. The water cooling jacket 26 has a cooling water flow path 26a through which the cooling water flows, and cools the metal chamber 21 by supplying the cooling water to the cooling water flow path 26a, and suppresses the heat influence from the inside of the metal chamber 21 to the outside.

The heat treatment apparatus further includes a microwave introducing unit 27 that introduces microwaves into the metal chamber 21 and heats the wafer W in the processing container 10. The microwave introducing unit 27 includes a microwave generation source 27a and a waveguide 27b. The microwave generation source 27a generates microwaves. The waveguide 27b is provided to penetrate the metal chamber 21, the heat insulating material 23, and the water cooling jacket 26, and transmits the microwave generated by the microwave generation source 27a and introduces the generated microwave into the metal chamber 21.

The microwave frequency is, for example, 2.45 GHz to 100 GHz, preferably 20 GHz to 100 GHz (quasi-millimeter wave to millimeter wave band), and particularly preferably 28 GHz. By setting the microwave frequency to 20 GHz to 100 GHz, it is possible to suppress the occurrence of standing waves in the metal chamber 21 and to uniformly heat the plurality of wafers W accommodated in the processing container 10. Further, by setting the frequency of the microwave to 20 GHz to 100 GHz, the microwave may be introduced into the metal chamber 21 with high output. Generally, a gyrotron is used when a microwave with a frequency of 30 GHz or higher is used with an output of 10 kW or higher, but a commercially available gyrotron is large. Therefore, by setting the microwave frequency to 28 GHz, a relatively small gyrotron may be used even when microwaves are generated with a high output of about 10 kW. Therefore, a gyrotron is easily applicable to the heat treatment apparatus. Further, when the microwave frequency is 28 GHz, arc discharge does not occur even under a reduced pressure, and thus the depressurization process may be performed with the microwave introduced into the processing container 10. Examples of the depressurization process include a low pressure chemical vapor deposition (LPCVD) and an atomic layer deposition (ALD).

The heat treatment apparatus further includes a controller 90 that controls the operation of each unit of the heat treatment apparatus. The controller 90 may be, for example, a computer. A computer program that controls the entire operation of the heat treatment apparatus is stored in a storage medium. The storage medium may be, for example, a flexible disk, a compact disk, a hard disk, a flash memory, or a DVD.

[Operation of Heat Treatment Apparatus]

Figure 2:
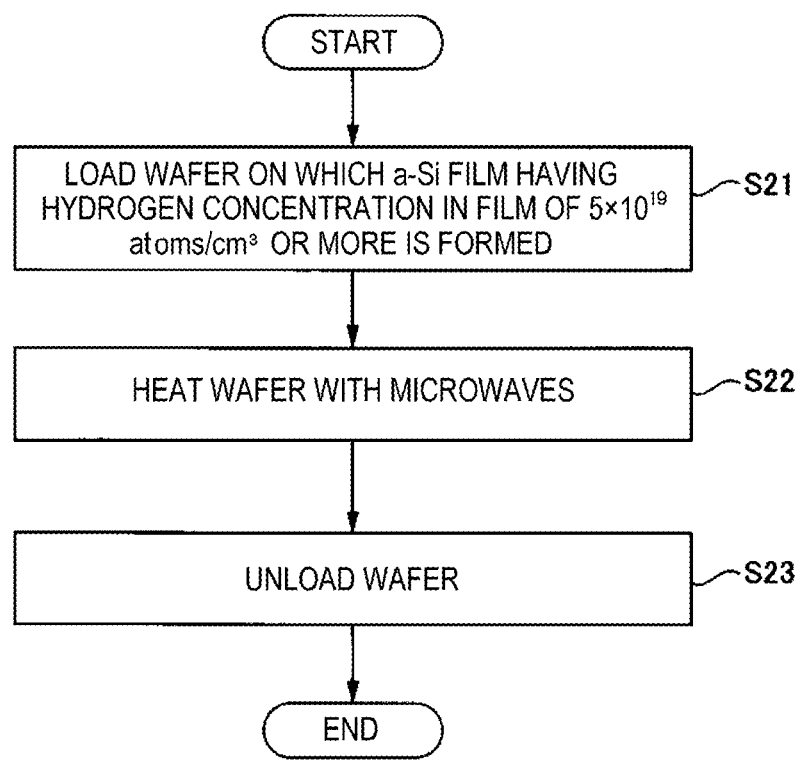
FIG. 2 is a flowchart illustrating an example of the operation of a heat treatment apparatus according to an embodiment.

Descriptions will be made on the operation (heat treatment method) of the heat treatment apparatus according to an embodiment. FIG. 2 is a flowchart illustrating an example of the operation of the heat treatment apparatus according to the embodiment. The heat treatment method illustrated in FIG. 2 is a method of forming a polycrystalline silicon film (hereinafter, also referred to as a "p-Si film") on the wafer W using the above-described heat treatment apparatus.

First, when the heat treatment method of FIG. 2 is started, the controller 90 controls each unit of the heat treatment apparatus to load the wafer W having the amorphous silicon film (hereinafter, also referred to as an "a-Si film") of high hydrogen concentration formed on the surface (step S21). The a-Si film of high hydrogen concentration is, for example, an a-Si film having a hydrogen concentration in the film of $5 \times 10^{19}$ atoms/cm$^3$ or more and $2 \times 10^{21}$ atoms/cm$^3$ or less. In the embodiment, the controller 90 controls the elevating unit to load the wafer boat 13 holding the plurality of wafers W into the processing container 10 and hermetically close and seal the lower end opening of the processing container 10 with the lid 12. An a-Si film having a hydrogen concentration in the film of $5 \times 10^{19}$ atoms/cm$^3$ or more is formed on the surface of each wafer W. Further, the controller 90 exhausts the gas in the processing container 10 through the exhaust pipe 17 to reduce the pressure in the processing container 10 to a predetermined pressure. The hydrogen concentration in the film is a value measured by the Rutherford Back-Scattering Spectroscopy (RBS) method or the Fourier Transform Infrared Spectroscopy (FTIR) method.

Subsequently, the controller 90 controls each unit of the heat treatment apparatus to heat the plurality of wafers W accommodated in the processing container 10 by microwaves (step S22). In the embodiment, the controller 90 controls the microwave generation source 27a to introduce microwaves into the metal chamber 21 via the waveguide 27b and heat the wafer W to a predetermined temperature. By heating the wafer W with microwaves, the a-Si film may be crystallized at low temperature and in a short time to form a p-Si film having a large grain size, as compared with a case where the resistance heating element is heated to heat the wafer W. Hereinafter, the heating of the wafer W by microwaves is also referred to as microwave heating, and the heating of the wafer W by the resistance heating element is also referred to as resistance heating. The predetermined temperature is a temperature at which the a-Si film is crystallized, and is, for example, 550° C. to 650° C.

In addition, the controller 90 controls the power source to cause the resistance heating element 24 to generate heat, and at the same time controls the microwave generation source 27a to introduce microwaves into the metal chamber 21, thereby heating the wafer W to a predetermined temperature. That is, the wafer W may be heated to a predetermined temperature by resistance heating and microwave heating. The predetermined temperature is a temperature at which the a-Si film is crystallized, and is, for example, 550° C. to 650° C.

In addition, the controller 90 controls the microwave generation source 27a to introduce the microwave into the metal chamber 21 after heating the wafer W to the first temperature by controlling the power supply to heat the resistance heating element 24. Then, the wafer W may be heated to the second temperature. That is, the main heating may be performed by microwave heating after performing preheating by resistance heating. The first temperature is lower than the temperature at which the a-Si film is crystallized, and is, for example, 200° C. to 400° C. The second temperature is higher than the first temperature and is a temperature at which the a-Si film is crystallized, and is, for example, 550° C. to 650° C.

As described above, by using the resistance heating and the microwave heating together, it is possible to suppress the heat radiation from the wafer W to the metal chamber 21 through a quartz pipe (the inner pipe 10a and the outer pipe 10b) which is hard to be heated by the microwave. Therefore, the wafer W may be heated at high speed with good in-plane uniformity and good inter-plane uniformity. As a result, a polycrystalline silicon film may be formed with good in-plane uniformity and good inter-plane uniformity.

Subsequently, the controller 90 controls each unit of the heat treatment apparatus to unload the wafer W that has been subjected to the heat treatment (step S23). In the embodiment, the controller 90 supplies the purge gas from the gas supply pipe 16 into the processing container 10 and returns the inside of the processing container 10 to the atmospheric pressure. Further, the controller 90 controls the elevating unit to unload the wafer boat 13 out of the processing container 10 and end the processing.

Next, descriptions will be made on an example of a method of forming an a-Si film having a hydrogen concentration in the film of $5 \times 10^{19}$ atoms/cm$^3$ or more on the wafer W. The a-Si film may be formed by using, for example, the above-described heat treatment apparatus or another film forming apparatus.

The wafer W is accommodated in a depressurizable processing container, the inside of the processing container is adjusted to a predetermined pressure, and a silicon-containing gas is supplied to the wafer W in a state where the wafer W is heated to a predetermined temperature. Thus, an a-Si film having a hydrogen concentration in the film of $5 \times 10^{19}$ atoms/cm$^3$ or more may be formed. The predetermined pressure and the predetermined temperature are determined according to the type of the silicon-containing gas. For example, when a monosilane (SiH$_4$) gas is used as the silicon-containing gas, the a-Si film having the hydrogen concentration in the film of $5 \times 10^{19}$ atoms/cm$^3$ or more may be formed by adjusting the inside of the processing container to 100 Pa to 600 Pa and heating the wafer W to 400° C. to 470° C. Further, for example, when a disilane (SiH$_2$) gas is used as the silicon-containing gas, the a-Si film having the hydrogen concentration in the film of $5 \times 10^{19}$ atoms/cm$^3$ or more may be formed by adjusting the inside of the processing container to 50 Pa to 500 Pa and heating the wafer W to 300° C. to 420° C.

Embodiment

Descriptions will be made on an example performed to confirm the effect achieved by the heat treatment apparatus according to the embodiment.

In a first embodiment, a silicon wafer in which an a-Si film having a hydrogen concentration in the film of $6 \times 10^{20}$, $5 \times 10^{19}$, $3 \times 10^{19}$, and $1 \times 10^{19}$ atoms/cm$^3$ is formed on a silicon oxide (SiO$_2$) film is heated at 520° C. for 50 minutes by microwave heating. Subsequently, the crystallized state of the a-Si film is confirmed by observing the cross section of each silicon wafer with a transmission electron microscope (TEM).

FIG. 3 is a diagram illustrating a crystallized state of the a-Si film. FIG. 3 illustrate a hydrogen concentration in the film [atoms/cm$^3$], an annealing temperature [° C.], an annealing time [min], and a TEM image in order from the left side. The hydrogen concentration in the film is a hydrogen concentration of the a-Si film before heating (annealing). The annealing temperature is a temperature at which the silicon wafer is heated by microwave heating. The annealing time is the time for heating the silicon wafer by microwave heating. The TEM image is an image obtained by observing the cross section of the silicon wafer after microwave heating with a TEM.

As illustrated in FIG. 3, it may be seen that the a-Si film is not crystallized when the hydrogen concentration in the film is $6\times10^{20}$ atoms/cm$^3$. Further, it is understood that when the hydrogen concentration in the film is $5\times10^{19}$ atoms/cm$^3$, the a-Si film is partially crystallized. In addition, it is understood that most of the a-Si film is crystallized when the hydrogen concentration in the film is $3\times10^{19}$ atoms/cm$^3$ and $1\times10^{19}$ atoms/cm$^3$. From these results, it is understood that when heated at the same temperature, crystallization is less likely to proceed in the a-Si film having a higher hydrogen concentration in the film.

In a second embodiment, with respect to a-Si films having different hydrogen concentrations in the film, a relationship between the hydrogen concentration in the film and the activation energy for crystallization has been evaluated by the RBS method.

Figure 4:
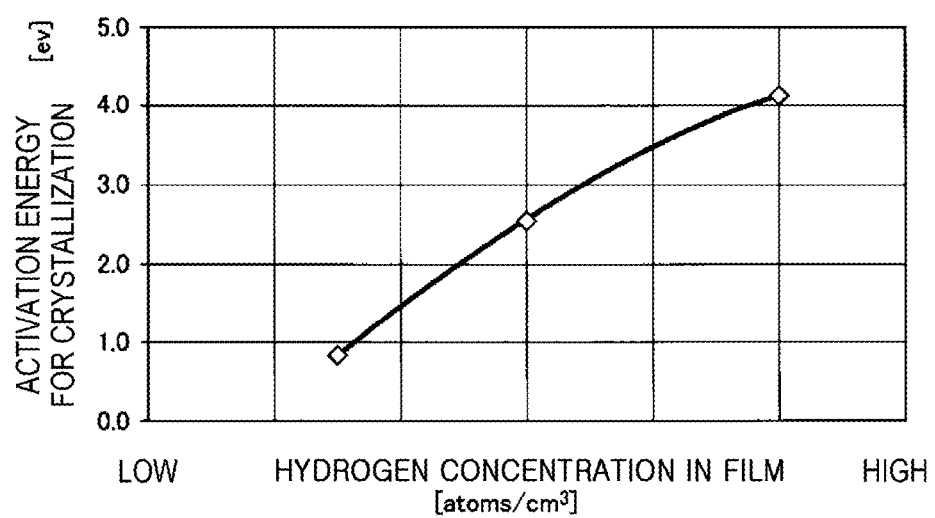
FIG. 4 is a diagram illustrating a relationship between a hydrogen concentration in the film of the a-Si film and an activation energy for crystallization.

FIG. 4 is a diagram illustrating a relationship between the hydrogen concentration of the a-Si film and the activation energy for crystallization. In FIG. 4, the horizontal axis represents the hydrogen concentration [atoms/cm$^3$] of the a-Si film, and the vertical axis represents the activation energy [eV] for crystallization.

As illustrated in FIG. 4, it is understood that the activation energy for crystallization increases as the hydrogen concentration in the film increases. From this result, it is understood that when an a-Si film having a high hydrogen concentration in the film is used, the temperature at which the a-Si film is crystallized becomes high.

In a third embodiment, the crystal grain size of the p-Si film formed by heating the a-Si film has been evaluated when the hydrogen concentration of the a-Si film or the heating method of the a-Si film has been changed.

Figure 5:
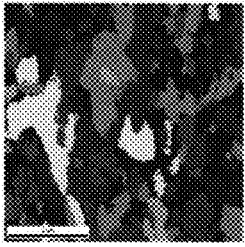
FIG. 5 is a diagram illustrating a result of evaluating crystallinity when an a-Si film having a hydrogen concentration in the film of $1\times10^{20}$ atoms/cm$^3$ is heated by microwaves.
Figure 5:
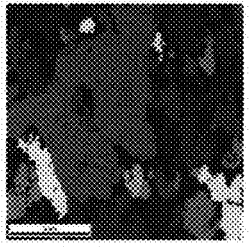
Figure 6:
FIG. 6 is a diagram illustrating a result of evaluating crystallinity when an a-Si film having a hydrogen concentration in the film of $5\times10^{19}$ atoms/cm$^3$ is heated by microwaves.
Figure 6:
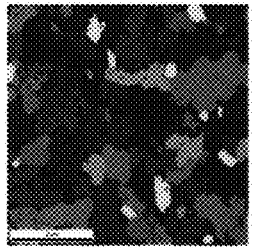
Figure 7:
FIG. 7 is a diagram illustrating a result of evaluation of crystallinity when an a-Si film having a hydrogen concentration in the film of $3\times10^{19}$ atoms/cm$^3$ is heated by microwaves.
Figure 7:
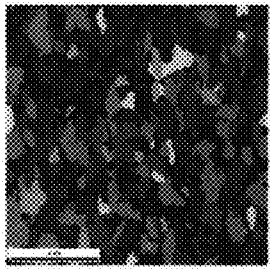

FIG. 5 is a diagram illustrating a result of evaluating crystallinity when an a-Si film having a hydrogen concentration in the film of $1\times10^{20}$ atoms/cm$^3$ is heated by microwaves. FIG. 6 is a diagram illustrating a result of evaluating crystallinity when an a-Si film having a hydrogen concentration in the film of $5\times10^{19}$ atoms/cm$^3$ is heated by microwaves. FIG. 7 is a diagram illustrating a result of evaluating crystallinity when an a-Si film having a hydrogen concentration in the film of $3\times10^{19}$ atoms/cm$^3$ is heated by microwaves. FIG. 8 is a diagram illustrating a result of evaluation of crystallinity when an a-Si film having a hydrogen concentration in the film of $1\times10^{20}$ atoms/cm$^3$ is heated by microwaves.

In FIGS. 5 to 8, the heating method, the hydrogen concentration in the film, the EBSD mapping image, the average particle size, and the maximum particle size are illustrated in order from the top.

The heating method is a method of heating the a-Si film, which is microwave heating or resistance heating. In the microwave heating, the temperature of the substrate on which the a-Si film is formed is heated to 600° C. to 650° C. by irradiating the a-Si film with microwaves having a frequency of 28 GHz, and the temperature is maintained for 2 to 4 hours. In the resistance heating, the temperature of the substrate on which the a-Si film is formed is raised to 620° C. to 670° C. by heating the resistance heating element, and the temperature is maintained for 6 to 12 hours.

The hydrogen concentration in the film is a hydrogen concentration of the a-Si film before heating.

The EBSD mapping image is an image illustrating a result of observing the crystal grain size of the p-Si film by the electron back scattered diffraction (EBSD) method. The image on the left illustrates the result obtained when the twin grain boundary Σ3-CSL is used as the crystal grain boundary, and the image on the right illustrates the result obtained when the twin grain boundary Σ3-CSL is not used as the crystal grain boundary.

The average grain size and the maximum grain size are the average value and the maximum value of the crystal grain size of the p-Si film calculated based on the images obtained by the EBSD method, respectively.

As illustrated in FIG. 5, the average grain size and the maximum grain size of the p-Si film obtained when the a-Si film having a hydrogen concentration in the film of $1\times10^{20}$ atoms/cm$^3$ is heated by microwaves, are 0.36 μm and 2.02 μm, respectively, when the twin grain boundary Σ3-CSL is used as the crystal grain boundary. Further, when the twin grain boundary Σ3-CSL is not used as the crystal grain boundary, the average grain size and the maximum grain size of the p-Si film are 0.48 μm and 3.71 μm, respectively.

As illustrated in FIG. 6, the average grain size and the maximum grain size of the p-Si film obtained when the a-Si film having a hydrogen concentration in the film of $5\times10^{19}$ atoms/cm$^3$ is heated by microwaves, are 0.30 μm and 1.15 μm, respectively, when the twin grain boundary Σ3-CSL is used as the crystal grain boundary. Further, when the twin grain boundary Σ3-CSL is not used as the crystal grain boundary, the average grain size and the maximum grain size of the p-Si film are 0.43 μm and 1.35 μm, respectively.

As illustrated in FIG. 7, the average grain size and the maximum grain size of the p-Si film obtained when the a-Si film having a hydrogen concentration in the film of $3\times10^{19}$ atoms/cm$^3$ is heated by microwaves, are 0.25 μm and 0.78 μm, respectively, when the twin grain boundary Σ3-CSL is used as the crystal grain boundary. Further, when the twin grain boundary Σ3-CSL is not used as the crystal grain boundary, the average grain size and the maximum grain size of the p-Si film are 0.30 μm and 0.78 μm, respectively.

In addition, as illustrated in FIG. 8, the average grain size and the maximum grain size of the p-Si film obtained when the a-Si film having a hydrogen concentration in the film of $1\times10^{20}$ atoms/cm$^3$ is heated by microwaves, are 0.24 μm and 1.35 μm, respectively, when the twin grain boundary Σ3-CSL is used as the crystal grain boundary. Further, when the twin grain boundary Σ3-CSL is not used as the crystal grain boundary, the average grain size and the maximum grain size of the p-Si film are 0.44 μm and 2.15 μm, respectively.

From the results of FIG. 5 to FIG. 7, it may be said that by using the a-Si film having a hydrogen concentration in the film of $1\times10^{20}$ atoms/cm$^3$ and $5\times10^{19}$ atoms/cm$^3$, it is possible to form a p-Si film having a large grain size as compared with the case of using the a-Si film having a hydrogen concentration in the film of $3\times10^{19}$ atoms/cm$^3$.

In addition, from the results of FIG. 5 and FIG. 8, it may be said that when the hydrogen concentration in the film is the same, it is possible to form a p-Si film having a larger grain size by using the microwave heating than by using the resistance heating, despite heating at low temperature for a short time.

As described above, according to the embodiment, by irradiating the substrate with microwaves, the a-Si film formed on the substrate is heated to crystallize the a-Si film and form p-Si. As a result, a p-Si film having a large grain size may be formed at low temperature and in a short time, as compared with the resistance heating using a resistance heating element. That is, a p-Si film having a high carrier mobility may be formed at low temperature in a short time.

Further, according to the embodiment, the p-Si film is formed using an a-Si film having a hydrogen concentration in the film of $5\times10^{19}$ atoms/cm$^3$ or more. As a result, the p-Si film having a larger grain size may be formed as compared with the case where a p-Si film is formed using an a-Si film having a hydrogen concentration in the film of about $3\times10^{19}$ atoms/cm$^3$ which is used in the related art. That is, the p-Si film having a high carrier mobility may be formed.

Further, according to the embodiment, an a-Si film is formed on a substrate, and the formed a-Si film is heated to form a p-Si film. As a result, a film having a good step coverage may be formed as compared with the case where the p-Si film is directly formed on the substrate.

As described above, since the p-Si film formed according to the embodiment has a good step coverage and a high carrier mobility, the p-Si film is suitable as channel silicon for 3D-NAND.

In the above embodiment, the heat insulating material 23 and the resistance heating element 24 are examples of a first heater, and the microwave introducing unit 27 is an example of a second heater. Further, the wafer boat 13 is an example of a substrate holder, and the gas supply pipe 16 is an example of a gas supply.

According to the present disclosure, a polycrystalline silicon film having a large grain size may be formed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A heat treatment method comprising:
    forming an amorphous silicon film having a hydrogen concentration of $5\times10^{19}$ atoms/cm$^3$ to $2\times10^{21}$ atoms/cm$^3$, on a substrate by supplying a nonmetal-containing gas to a processing container in a state where an inside of the processing container is a pressure lower than atmospheric pressure and the substrate is heated in a range of 300° C. to 420° C.;
    after the forming the amorphous silicon film on the substrate, heating the amorphous silicon film having the hydrogen concentration of $5\times10^{19}$ atoms/cm$^3$ to $2\times10^{21}$ atoms/cm$^3$ with heat generated by a resistance heating element including a wire to a first temperature; and
    after the heating the amorphous silicon film with the heat generated by the resistance heating element, irradiating the substrate with microwaves to heat the amorphous silicon film to a second temperature that is higher than the first temperature thereby forming a polycrystalline silicon film from the amorphous silicon film.

2. The heat treatment method according to claim 1, wherein in the forming of the polycrystalline silicon film, the substrate is irradiated with microwaves while the substrate is heated by the heat generated by the resistance heating element.

3. The heat treatment method according to claim 2, wherein a frequency of the microwaves is in a range from 20 GHz to 100 GHz.

4. The heat treatment method according to claim 3, wherein the hydrogen concentration in the amorphous silicon film is $1\times10^{20}$ atoms/cm$^3$.

5. The heat treatment method according to claim 1, wherein a frequency of the microwaves is in a range from 20 GHz to 100 GHz.

6. The heat treatment method according to claim 1, wherein the hydrogen concentration in the amorphous silicon film is $1\times10^{20}$ atoms/cm$^3$.

7. The heat treatment method according to claim 1, wherein the first temperature is in a range of 200° C. to 400° C., and the second temperature is in a range of 550° C. to 650° C.

8. The heat treatment method according to claim 1, wherein, in the forming the amorphous silicon film, the nonmetal-containing gas is a disilane gas and the inside of the processing container is adjusted in a range of 50 Pa to 500 Pa.

* * * * *